US012240788B2

United States Patent
Coppola et al.

(10) Patent No.: US 12,240,788 B2
(45) Date of Patent: Mar. 4, 2025

(54) SILICON CARBIDE BODY WITH LOCALIZED DIAMOND REINFORCEMENT

(71) Applicant: II-VI Delaware, Inc., Wilmington, DE (US)

(72) Inventors: Jon Coppola, Wilmington, DE (US); Nicholas Coombs, Wilmington, DE (US); Jiwen Wang, Wilmington, DE (US); Michael K. Aghajanian, Wilmington, DE (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 18/156,246

(22) Filed: Jan. 18, 2023

(65) Prior Publication Data

US 2023/0150885 A1 May 18, 2023

Related U.S. Application Data

(62) Division of application No. 17/248,309, filed on Jan. 19, 2021, now Pat. No. 11,584,694.

(51) Int. Cl.
*C04B 35/565* (2006.01)
*C04B 35/563* (2006.01)
(Continued)

(52) U.S. Cl.
CPC .......... *C04B 35/565* (2013.01); *C04B 35/563* (2013.01); *C04B 41/4523* (2013.01);
(Continued)

(58) Field of Classification Search
CPC ................ C04B 35/565; C04B 35/563; C04B 2235/427; C04B 2235/428; H01L 21/687
See application file for complete search history.

(56) References Cited

U.S. PATENT DOCUMENTS

| 6,551,176 B1 | 4/2003 | Garretson |
| 9,469,918 B2 | 10/2016 | Xu et al. |

(Continued)

FOREIGN PATENT DOCUMENTS

| DE | 102007063517 B3 | 1/2009 |
| EP | 2924506 A2 | 9/2015 |

(Continued)

OTHER PUBLICATIONS

"Chemical bonding: Reaction bonded silicon carbide, Encyclopedia Brittanica,", https://www.britannica.com/technology/advanced-ceramics/Chemical-bonding#ref609309 accessed Sep. 15, 2023. (Year: 2023).

(Continued)

*Primary Examiner* — James A Fiorito
*Assistant Examiner* — Cameron K Miller
(74) *Attorney, Agent, or Firm* — Blank Rome LLP

(57) ABSTRACT

A reaction-bonded silicon carbide (SiC) body is produced by: providing a preform including ceramic elements and carbon, and one or more surface features; providing a powder which includes diamond particles and carbon; locating the powder in the surface feature(s); and infiltrating the preform and the powder with molten silicon (Si) to form reaction-bonded SiC in the preform, and to form reaction-bonded SiC coatings on the diamond particles. The present disclosure also relates to a device/component which includes: a main body portion and discrete elements located at least partially within the main body portion. The main body portion may include reaction-bonded SiC and Si, but not diamond, while the discrete elements include diamond particles, reaction-bonded SiC coatings surrounding the diamond particles, and Si. According to the present disclosure, diamond may be advantageously located only where it is needed.

12 Claims, 4 Drawing Sheets

(51) Int. Cl.
    *C04B 41/45*     (2006.01)
    *C04B 41/50*     (2006.01)
    *H01L 21/687*     (2006.01)

(52) U.S. Cl.
    CPC ...... *C04B 41/4584* (2013.01); *C04B 41/5096* (2013.01); *H01L 21/687* (2013.01); *C04B 2235/427* (2013.01); *C04B 2235/428* (2013.01)

(56) References Cited

U.S. PATENT DOCUMENTS

| | | | |
|---|---|---|---|
| 2005/0203630 A1* | 9/2005 | Pope | A61F 2/30767 623/20.28 |
| 2007/0051354 A1 | 3/2007 | Sung | |
| 2014/0109756 A1 | 4/2014 | Aghjanian et al. | |
| 2017/0291279 A1 | 10/2017 | Karandikar et al. | |
| 2017/0313627 A1 | 11/2017 | Shim et al. | |
| 2018/0099379 A1 | 4/2018 | Mastrobattisto et al. | |
| 2021/0002534 A1 | 1/2021 | Matthey et al. | |
| 2021/0179498 A1* | 6/2021 | Katsikis | C04B 35/63 |
| 2021/0331985 A1* | 10/2021 | Salamone | C04B 41/87 |
| 2022/0227676 A1 | 7/2022 | Coppola et al. | |

FOREIGN PATENT DOCUMENTS

| | | |
|---|---|---|
| JP | H05335529 A | 12/1993 |
| JP | 2006501073 A | 1/2006 |
| JP | 2019513564 A | 5/2019 |
| WO | 2004028746 A2 | 4/2004 |
| WO | 2019175333 A1 | 9/2019 |

OTHER PUBLICATIONS

"Japanese Office Action issued Jun. 29, 2022 and English translation".

Aghajanian, et al., "A New Family of Reaction Bonded Ceramics for Armor Applications,", Pac Rim 4, Nov. 4-8, 2011, Paper No. PACB-H-044-2001.

Luo, Zhaohua, et al., "Development of SiC-SiC Joint by Reaction Bonding Method Using SiC/C Tapes as the Interlayer", Journal of the European Ceramic Society, 2012; 32:3819-3824 (XP028427001).

Salamone, et al., "Effects of Si:SiC Ratio and SiC Grain Size on Properties of RBSC,", Ceramic Engineering and Science Proceedings, vol. 28, No. 2, (2007), 101-109.

Shi-Bin, Li, et al., "Reaction Forming of Joints in Silicon Carbide Ceramic Materials", Materials Science and Engineering A, 2008, 483-484:747-750 (XP022619350).

"JPH05335529A machine translation (Year: 1993)".

* cited by examiner

SILICON CARBIDE BODY WITH LOCALIZED DIAMOND REINFORCEMENT

CROSS-REFERENCE TO RELATED APPLICATIONS

This application is a divisional of U.S. patent application Ser. No. 17/248,309 filed Jan. 19, 2021. The aforementioned application is hereby incorporated by reference in its entirety.

BACKGROUND

U.S. Pat. No. 9,469,918, issued Oct. 18, 2016, refers to a multilayer substrate which includes a diamond layer and a composite layer, where the diamond layer is grown on the composite layer, and where the composite layer includes diamond and silicon carbide (SiC), and, optionally, silicon (Si). According to U.S. Pat. No. 9,469,918, the composite layer may be formed by mixing diamond particles with SiC particles or a SiC-forming precursor. The entire disclosure of U.S. Pat. No. 9,469,918 is expressly incorporated herein by reference.

United States Patent Application Publication No. 2021/0002534, based on International Application No. PCT/EP2019/056457, filed Mar. 14, 2019, refers to SiC-bound hard diamond material particles. According to United States Patent Application Publication No. 2021/0002534, diamond particles may be embedded in a matrix of reaction-formed SiC. The entire disclosure of United States Patent Application Publication No. 2021/0002534 is expressly incorporated herein by reference.

SUMMARY

The present disclosure relates to a method of making a reaction-bonded silicon carbide (SiC) body, where the method includes: providing a preform including ceramic elements and carbon, wherein the preform includes one or more openings; providing a powder, wherein the powder includes diamond particles and carbon; locating the powder in the one or more surface features; and infiltrating the preform and the powder with molten silicon (Si), to form reaction-bonded (SiC) in the preform, and to form reaction-bonded SiC coatings on the diamond particles.

The present disclosure also relates to a reaction-bonded SiC body which includes: a main body portion and discrete elements located at least partially within the main body portion. According to one aspect of the present disclosure, the main body portion may include reaction-bonded SiC and elemental Si, but not diamond, while the discrete elements include diamond particles, reaction-bonded SiC coatings surrounding the diamond particles, and elemental Si. The present disclosure is applicable to a variety of devices, including, for example, a vacuum wafer chuck.

According to the present disclosure, reaction-bonded SiC parts may be provided with localized diamond reinforcement; diamond may be located where it is needed but only where it is needed, which is advantageous because, although diamond has many desirable characteristics, it may be difficult to machine (cut, grind, shape, etc.), and it may be expensive. Thus, if desired, a SiC+carbon preform may be machined to have surface features such as openings, recesses, trenches, cavities, or dimples. The surface features are at least partially filled with diamond powder. Then, the assembly is reactivity infiltrated with molten Si. The result is a dense, reaction-bonded SiC body with diamond reinforcement at only select, desirable locations.

BRIEF DESCRIPTION OF THE DRAWINGS

The same reference numbers or other feature designators are used in the figures to designate the same or similar features.

DETAILED DESCRIPTION

Figure 1:
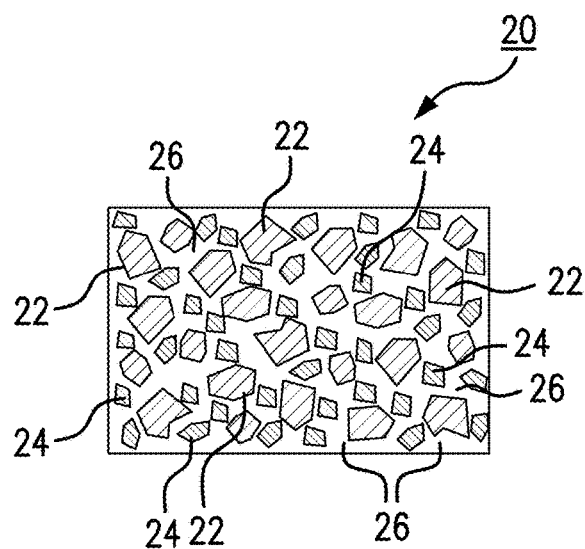
FIG. 1 is a cross-sectional view of an example of a reaction-bonded ceramic material which does not contain diamond.
Figure 2:
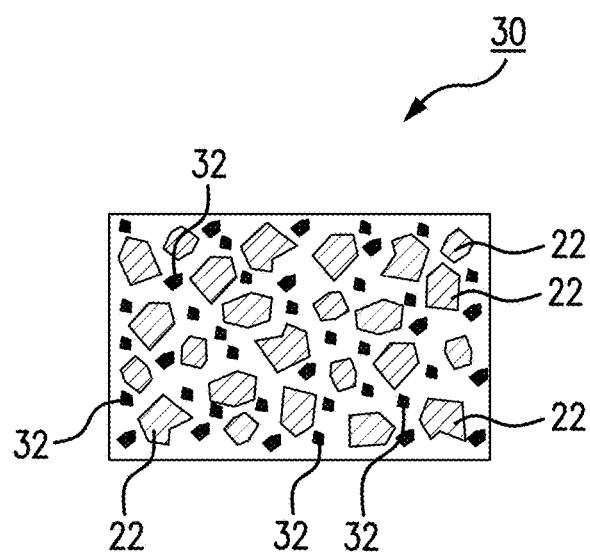
FIG. 2 is a cross-sectional view of a preform for a method of making the reaction-bonded ceramic material of FIG. 1.

FIG. 1 is a cross-sectional view of a reaction-bonded ceramic material 20 which includes ceramic particles 22, reaction-formed silicon carbide (SiC) particles 24, and residual elemental silicon (Si) 26. The ceramic particles 22 may include SiC or boron carbide ($B_4C$). The ceramic material 20 may be produced by performing a reactive-infiltration process on a preform 30 (FIG. 2) which includes the ceramic particles 22 and elemental carbon 32. During the infiltration process, molten Si infiltrates the preform 30 to form the reaction-formed SiC particles 24. That is, the molten Si reacts with the carbon 32 to form additional SiC. Despite the infiltration of Si into the preform 30, the process may result in only a small increase in volume (the increase in volume of the ceramic material 20 compared to that of the preform 30) that is less than one percent. The ceramic material 20 illustrated in FIG. 1 does not contain diamond.

Figure 3:
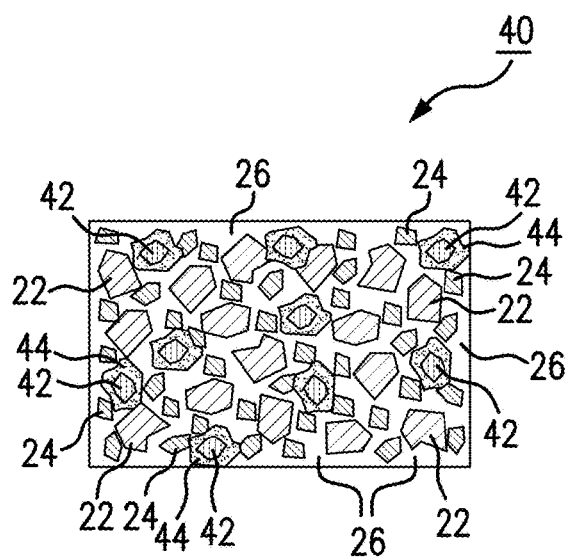
FIG. 3 is a cross-sectional view of an example of a reaction-bonded ceramic material which contains diamond.
Figure 4:
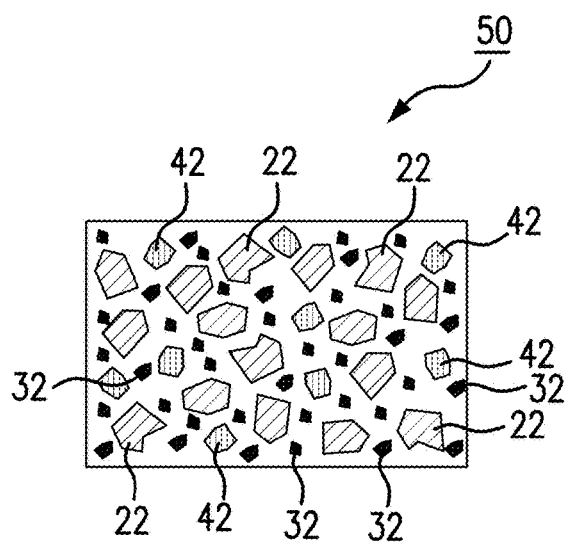
FIG. 4 is a cross-sectional view of a preform, which may be a powder, for a method of making the reaction-bonded ceramic material of FIG. 3.

FIG. 3 is a cross-sectional view of a reaction-bonded ceramic material 40 which includes reaction-formed SiC particles 24, residual elemental Si 26, diamond particles 42, reaction-formed SiC coatings 44 located on and surrounding the diamond particles 42, and, optionally, ceramic particles 22. The ceramic particles 22, if desired, may include SiC or $B_4C$. The ceramic material 40 may be produced by performing a reactive-infiltration process on a preform 50 (FIG. 4) which may include powder, and which includes the optional ceramic particles 22, elemental carbon 32, and the diamond particles 42. During the reactive-infiltration process, molten Si infiltrates the preform 50 to form the reaction-formed SiC particles 24 and the reaction-formed SiC coatings 44. If desired, the coatings 44 may completely surround the diamond particles 42 such that the coatings 44 appear as halos surrounding the particles 42 in the cross-sectional view of FIG. 3. During the reactive-infiltration process, the molten Si reacts with the carbon 32 to form additional SiC, and the molten Si also reacts with surfaces of the diamond particles 42 to produce the reaction-formed SiC coatings 44. Despite the infiltration of the molten Si into the preform 50, the process may result in only a small increase in volume (the increase in volume of the ceramic material 40 compared to that of the preform 50) that is less than one percent.

The material 40 illustrated in FIG. 3, which includes a composite of reaction bonded SiC 24, 44+diamond particles 42 (Si—SiC-diamond), may be considered for many high end applications, because the material 40 may have low thermal expansion, high thermal conductivity, high hardness, high wear resistance, high stiffness, and low coefficient of friction. However, the diamond particles 42 may make the material 40 extremely difficult to machine (cut, grind, and/or shape). Thus, according to the present disclosure, discrete reinforcement elements may be provided for a reaction-bonded SiC body, where the reinforcement elements include the diamond particles 42 while the body does not contain diamond. According to the present disclosure, the diamond-containing material 40 illustrated in FIG. 3 may be located only where needed to provide desired performance. The remainder of the body may be formed of the material 20 illustrated in FIG. 1, which contains reaction-bonded SiC 24 but no diamond, and which is well suited to cost-effective machining.

Diamond has many desirable characteristics for a variety of useful applications. Such characteristics include extremely high hardness for wear resistance, very low coefficient of friction for sliding applications, very high stiffness (Young's modulus) for structural applications, and extreme thermal stability (high thermal conductivity and low coefficient of thermal expansion (CFE)). Tables 1 through 3 list desirable characteristics of diamond compared to other materials:

TABLE 1

| Material | Density (g/cc) | Young's Modulus (GPa) | CTE (ppm/K) | Thermal Conductivity (W/mK) |
| --- | --- | --- | --- | --- |
| Al (6061) | 2.7 | 70 | 23 | 172 |
| Steel (17-4PH SS) | 7.8 | 196 | 11 | 18 |
| SiC (Sintered) | 3.1 | 410 | 3 | 125 |
| Diamond | 3.5 | 1220 | 1 | 2200 |

TABLE 2

| Material | Coefficient of Friction |
| --- | --- |
| Teflon | 0.05 |
| Diamond | 0.1 |
| Glass | 0.5-0.7 |
| SiC | 0.55-0.85 |
| Steel | 0.8 |
| Aluminum | 1.0-1.4 |

TABLE 3

| Hardness Comparison (Knoop) | |
| --- | --- |
| SiSiC | 1100 kg/mm$^2$ |
| RB-B$_4$C | 1700 kg/mm$^2$ |
| Sp3 Diamond | 2300 kg/mm$^2$ |
| Diamond-Like-Carbon (DLC) | ~950-1200 kg/mm$^2$ |

Figure 5:
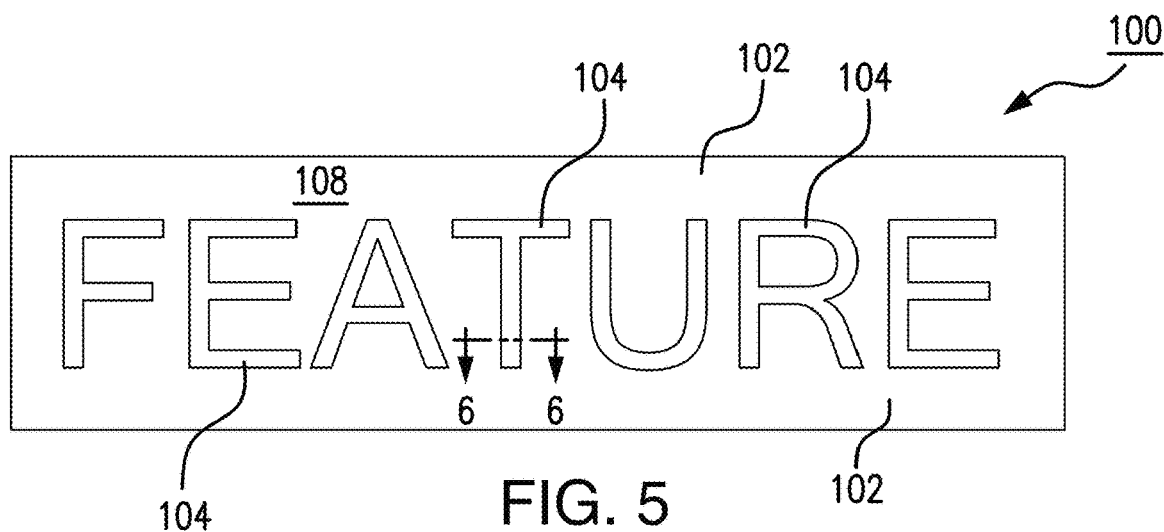
FIG. 5 is a top view of an example of a multi-component block constructed in accordance with the present disclosure.
Figure 6:
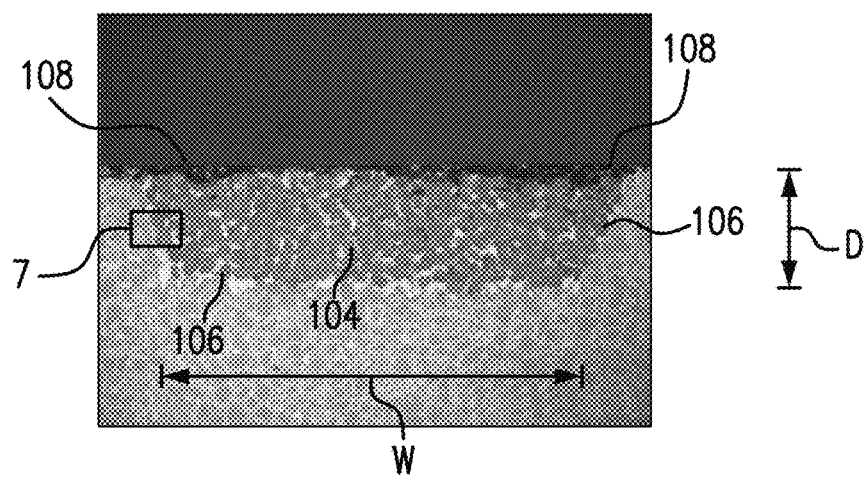
FIG. 6 is a cross-sectional view of a portion of the block of FIG. 5, taken along line 6-6.

FIG. 5 is a top view of an example of a multi-component block 100 constructed in accordance with the present disclosure. The illustrated block 100 includes a body 102 (an example of a main body portion) formed of the SiC-containing material 20 illustrated in FIG. 1, and discrete, spaced-apart features 104 formed of the diamond-containing material 40 illustrated in FIG. 3. The features 104 may be located in corresponding trenches 106 (examples of surface features, FIG. 6) that are laser machined into the top surface 108 of the SiC-containing body 102. In the illustrated example, each feature 104 may have a width W in a range of from 0.5 mm to 3.0 mm, preferably about 1.2 mm, and a depth D in a range of from 100 μm to 600 μm, preferably about 300 μm, and the trenches 106 may be at least partially filled with a suitable amount, such as nominally 65 μm, of diamond powder. The present disclosure should not be limited, however, to the details of the examples described herein.

Figure 7:
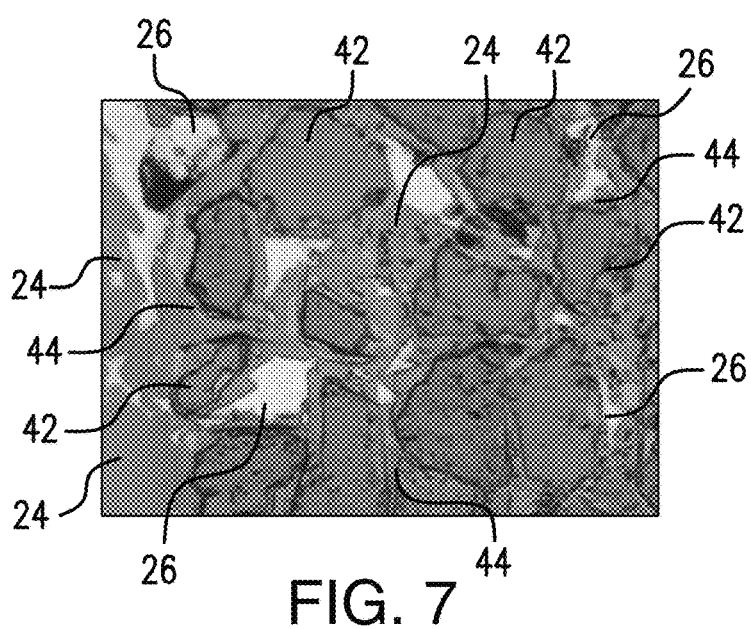
FIG. 7 is an expanded view of a portion 7 of the cross-sectional view of FIG. 6.

Then, after the trenches 106 are filled with diamond powder, molten Si is simultaneously infiltrated into the body 102 and the trenches 106 to create the material 20 illustrated in FIG. 1, with reaction-bonded SiC 24 (FIG. 7), in the body 102, and to create the diamond-containing material 40 within the trenches 106 (and only in the trenches 106). As a result, the multi-component block 100 can use the discrete features 104 to provide the high performance characteristics associated with the diamond-containing material 40 only where desired, while the remainder of the block 100 (that is, the body 102) contains reaction-formed SiC but no diamond and therefore may be more easily machined.

In other words, the illustrated multi-component block 100 may have hard, thermally-conductive diamond-reinforced composite material 40 where needed (and only where needed), and reaction-bonded SiC 20 (without diamond) in other areas for ease of machining. The body 102 and the features 104 illustrated in FIG. 5 represent one example of a wide variety of applications where local diamond-containing reinforcement may have value, such as where very hard, low-friction material is desired only at a particular location of a component where wear would otherwise occur, or to provide thermally stable, very high thermal conductivity pathways only where heat sinking and/or heat spreading are required, or to provide very stiff (i.e., high Young's modulus) regions only where low mechanical deflection is desired.

In the illustrated example, the reactions that occur in the trenches 106, which involve Si+diamond, are different from the reactions that occur simultaneously elsewhere in the body 102, which involve Si+carbon but no diamond. As a result, the residual elemental Si content in the diamond-reinforced region (within the trenches 106) is lower than in the rest of the block 100. For example, the residual elemental Si in the diamond-reinforced region within the trenches 106 may be about 6.8% while the residual Si in the Si—SiC (and no diamond) region may be about 23.2%.

The lower residual Si content in the diamond-reinforced region may yield improved properties (hardness, stiffness, inertness, etc.), but the combination of diamond particles and low elemental Si content may make machining especially difficult, such that it may be especially advantageous to locate the diamond-containing features 104 only where needed. However, avoiding difficult machining is only one of many reasons why localizing diamond-containing features is advantageous. Another advantage of providing diamond reinforcement only where it can be put to effective use is reduced cost. In other words, it is advantageous to use high-cost diamond powder only where it is needed.

Figure 8:
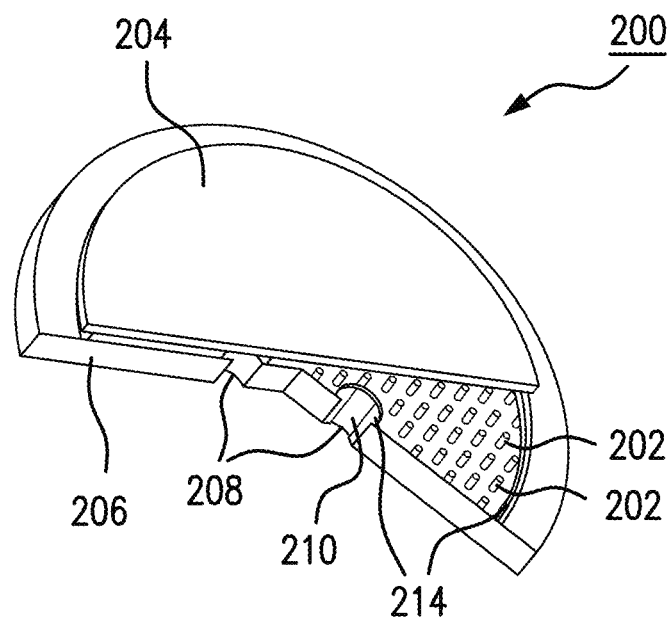
FIG. 8 is a broken-away perspective view of an example of a wafer chuck constructed in accordance with the present disclosure.
Figure 9:
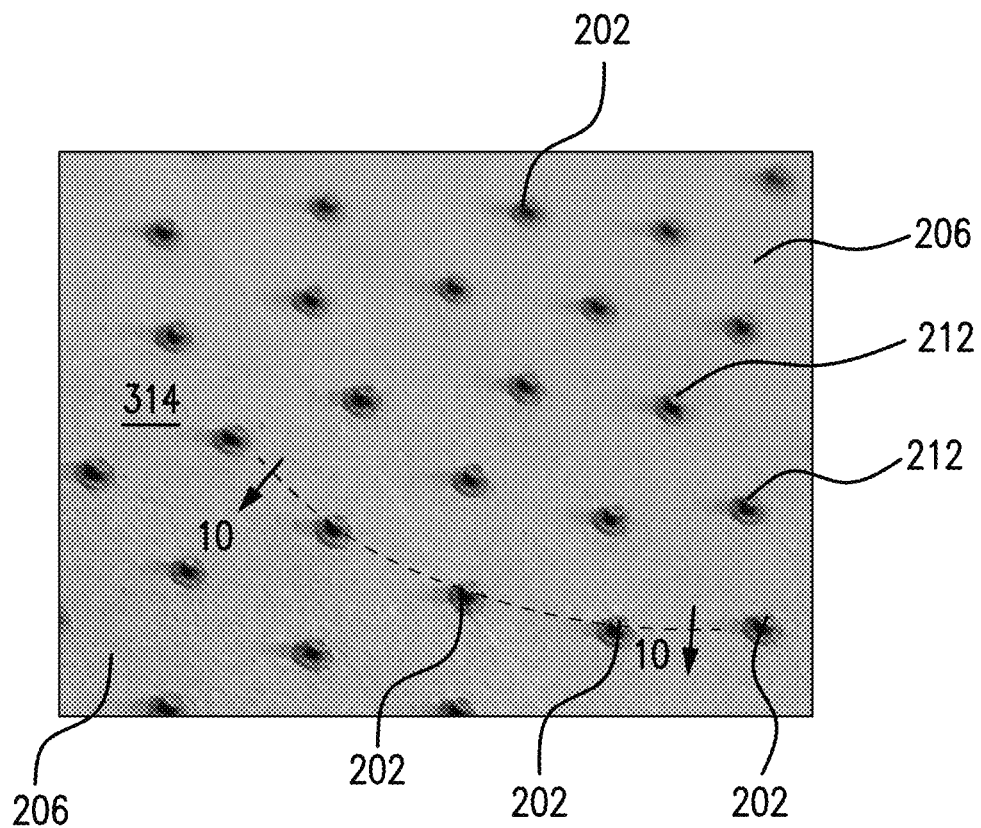
FIG. 9 is a perspective view of a portion of a chuck base of the wafer chuck of FIG. 8.
Figure 10:
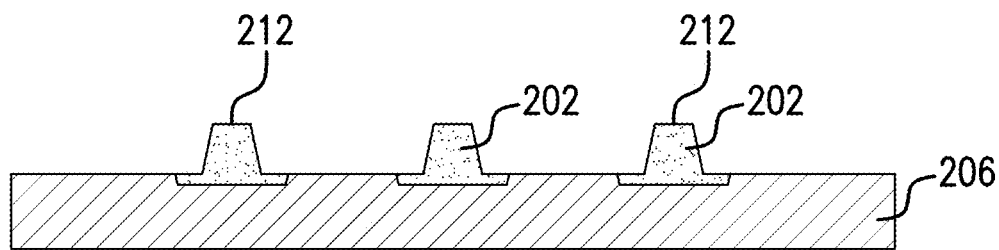
FIG. 10 is a cross-sectional view of a portion of the chuck base of FIG. 9, taken along line 10-10.

FIG. 8 shows an example of a semiconductor wafer chuck 200, with diamond-reinforced pins 202, for supporting a semiconductor (e.g., silicon) wafer 204. The illustrated wafer chuck 200 has a chuck base 206 (an example of a main body portion). Holes 208 are formed through the chuck base 206 to provide paths for vacuum exhaust and for supporting one or more lift pins 210. The chuck base 206 and the pins 202 may have a number of desirable characteristics for holding the wafer 204 during processing. Such characteristics include low density to allow fast motion, high stiffness for stability, low coefficient of thermal expansion for stability, high thermal conductivity to prevent distortion, high wear resistance (hardness) to maintain precision, and low coefficient of friction to prevent optical contact bonding between the wafer 204 and top surfaces 212 (FIGS. 9 and 10) of the pins 202, and the diamond-containing material 40 illustrated in FIG. 3 may have all such characteristics. Thus, in the illustrated example, the pins 202 (FIG. 10) may be formed of the diamond-containing material 40 illustrated in FIG. 3. Other portions of the chuck base 206, including ring seals 214, lift pin holes (210), mounting features, etc., may require machining and therefore may be formed of the easier-to-machine material 20 illustrated in FIG. 1.

Moreover, although the body 206 has a continuous region formed of monolithic reaction bonded SiC, the discrete (that is, separated) positioning of the diamond-reinforced pins 202 should prevent bi-metallic strip non-uniformity. In other words, an advantageous feature of providing localized diamond-containing elements according to the present disclosure is that bi-metallic strip stresses can be prevented.

Figure 11:
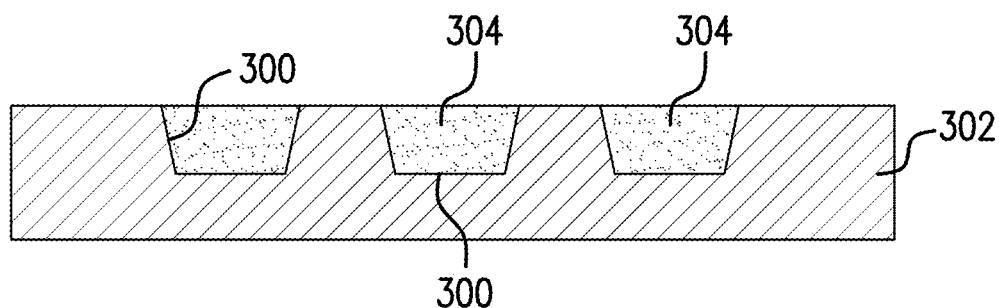
FIG. 11 is a cross-sectional view of the chuck base portion of FIG. 10 at a first stage of manufacture.
Figure 12:
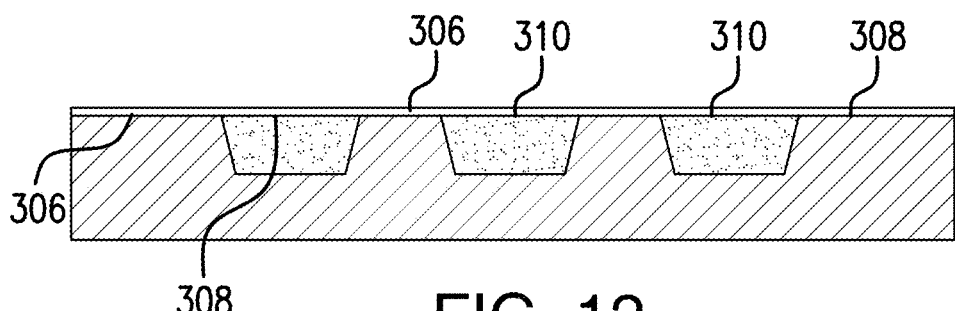
FIG. 12 is a cross-sectional view of the chuck base portion of FIG. 10 at a second stage of manufacture.
Figure 13:
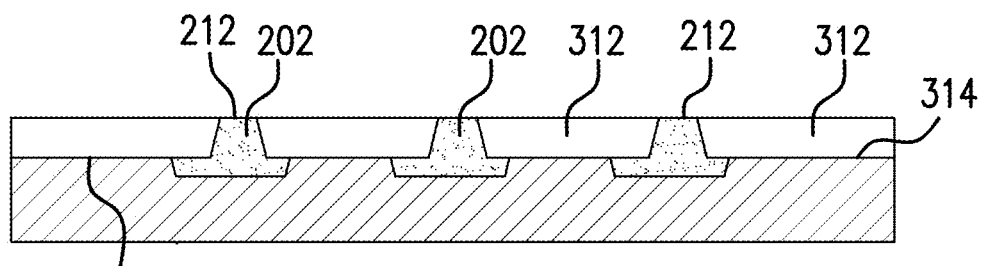
FIG. 13 is a cross-sectional view of the chuck base portion of FIG. 10 at a third stage of manufacture.

A method of making the reaction-bonded SiC body 206 (FIG. 10) with the diamond-reinforced, wafer-contacting pins 202 is illustrated in FIGS. 11-13. As illustrated in FIG. 11, openings 300 (examples of surface features), such as dimples, recesses, or cavities, are machined by a suitable process, for example, laser machined, into a preform 302 made of the SiC+carbon material 30 illustrated in FIG. 2. The openings 300 within the body 206 may be, for example, in the range of from 0.5 mm to 3 mm, preferably about 1 mm, in diameter, and in the range of from 200 µm to 700 µm, preferably about 500 µm, deep. The preform 302 may have, for example, a diameter that is suitable for use in connection with wafer-handling equipment, such as, for example, a diameter of about 100 mm. The present disclosure should not be limited, however, to the details of the examples described herein.

The openings 300 are then filled with a suitable amount, for example, about 30 µm, of powder 304 which contains diamond particles 42, and then the entire assembly (the dimpled preform 302 and the powder 304 within the dimples 300) is subjected to a reaction bonding process, that is, infiltrated with molten Si. The reaction bonding process converts the material of the preform 302 to the material 20 illustrated in FIG. 1 and converts the diamond-containing powder 304 to the material 40 illustrated in FIG. 3.

Referring now to FIG. 12, a layer 306 is then removed by simple surface grinding to produce a common top surface 308 for the reaction-bonded SiC material 20 and the diamond containing material 40, to thereby produce diamond-reinforced pads 310 co-planar with the common top surface 308.

Referring now to FIG. 13, valleys 312 may then be removed from the reaction-bonded SiC material 20 and the diamond containing material 40 by suitable laser-machining such that the pins 202 stand proud above the lowered top surface 314 of the chuck base 206. The diameters of the diamond-containing pins 202 may be, for example, in the range of from 200 um to 800 um, preferably about 400 um. The heights of the pins 202 may likewise be in the range of from 200 um to 800 um, preferably about 400 um, but these are just examples of how the present disclosure may be implemented. As noted above, the present disclosure should not be limited to the details of the examples described herein.

The present disclosure may be applicable to a variety of semiconductor wafer handling components, including vacuum wafer chucks, electrostatic chucks, wafer arms/end effectors, and susceptors. The present disclosure may also be applicable to a variety of other applications, especially where low wear, low friction, high mechanical stiffness, and/or extreme thermal stability in local areas is/are desired, including optics and optical mounts, thermal management/ heat sink devices, high energy laser (HEL) components, bearing seals, cylinder liners, gun barrels, lapping/grinding substrates, and artificial joints (hips, knees, etc.).

The present disclosure is applicable to a reaction-bonded SiC vacuum wafer chuck with standing-proud diamond-reinforced pins for wafer contact (to provide high wear resistance and stiffness, low friction, and high purity) while all areas requiring machining are free of diamond for ease of manufacture. The present disclosure is not limited, however, to the devices and processes described herein. The present disclosure may also be applicable to a reaction-bonded SiC heat sink with local areas of diamond reinforcement only at locations (e.g., directly under a die) where high heat flux is desired to maximize performance, while the rest of the device does not contain diamond so as to be more easily machinable during a manufacturing process. Moreover, the present disclosure may be applicable to a reaction-bonded SiC lapping/grinding plate with local diamond reinforcement at a wear face, where the reinforcing elements are in the form of discrete buttons (or other shapes) while other portions of the device are free of diamond for ease of machining.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A method of making a reaction-bonded silicon carbide body, comprising:
   providing a preform including ceramic particles and carbon,
   machining one or more surface features in the preform;
   providing a powder, wherein the powder includes diamond particles and carbon;

locating the powder in the one or more surface features, wherein the locating of the powder in the one or more surface features occurs after the machining of the one or more surface features in the preform;

infiltrating the preform and the powder with molten silicon, to form reaction-bonded silicon carbide in the preform, and to form reaction-bonded silicon coatings on the diamond particles.

2. The method of claim 1, wherein the ceramic particles include silicon carbide or boron carbide.

3. The method of claim 2, wherein the powder further includes ceramic particles.

4. The method of claim 1, wherein the machining includes laser machining.

5. The method of claim 1, wherein the one or more surface features include multiple openings separated from each other.

6. The method of claim 1, wherein the infiltrating of the preform and the powder leaves residual elemental silicon in the preform and in the powder.

7. The method of claim 6, wherein production of the reaction-bonded coatings causes less residual elemental silicon to be left in the powder than in the preform.

8. The method of claim 1, wherein the powder is located in the one or more surface features before the preform and the powder are infiltrated with the molten silicon.

9. The method of claim 1, wherein the reaction-bonded silicon carbide body is configured for use in a vacuum wafer chuck, with diamond-containing pins for supporting a semiconductor wafer in the vacuum wafer chuck.

10. The method of claim 1, wherein the reaction-bonded silicon carbide body made by the method includes: a main body portion, including reaction-bonded silicon carbide and elemental silicon, and not including diamond; and discrete elements located at least partially within the main body portion, including diamond particles, reaction-bonded silicon carbide coatings surrounding the diamond particles, and elemental silicon.

11. The method of claim 1, wherein the reaction-bonded silicon carbide body made by the method includes: a main body portion, including reaction-bonded silicon carbide and elemental silicon, and not including diamond; and discrete elements located at least partially within the main body portion, including diamond particles, reaction-bonded silicon carbide coatings surrounding the diamond particles, and elemental silicon; and wherein the discrete elements are configured to provide high heat flux directly under a die, without reducing the machinability of the main body portion.

12. The method of claim 1, wherein the reaction-bonded silicon carbide body made by the method includes: a main body portion, including reaction-bonded silicon carbide and elemental silicon, and not including diamond; and discrete elements located at least partially within the main body portion, including diamond particles, reaction-bonded silicon carbide coatings surrounding the diamond particles, and elemental silicon; and wherein the discrete elements are configured to provide local diamond reinforcement at a wear face, without reducing the machinability of the main body portion.

* * * * *